United States Patent [19]
Tessmer

[11] Patent Number: 5,499,734
[45] Date of Patent: Mar. 19, 1996

[54] LABYRINTH BARRIER VENTILATED WATERPROFF ENCLOSURE

[75] Inventor: Wallace D. Tessmer, Sacramento, Calif.

[73] Assignee: Tesco Controls, Inc., Sacramento, Calif.

[21] Appl. No.: 422,886

[22] Filed: Apr. 17, 1995

[51] Int. Cl.⁶ ........................................................ H02G 3/08
[52] U.S. Cl. .......................................... 220/4.21; 220/3.8
[58] Field of Search ............................. 220/3.8, 3.3, 3.2, 220/4.21, 242, 241

[56] References Cited

U.S. PATENT DOCUMENTS

| | | | |
|---|---|---|---|
| 1,302,137 | 4/1919 | Cook | 220/3.8 |
| 3,716,815 | 2/1973 | Riches | 220/3.8 |
| 4,381,063 | 4/1983 | Leong | 220/3.8 |
| 4,699,289 | 10/1987 | You | 220/3.8 |
| 4,979,634 | 12/1990 | Begley | 220/242 |
| 5,228,584 | 7/1993 | Williams, Jr. | 220/3.8 |
| 5,427,261 | 6/1995 | Naitou | 220/3.8 |
| 5,435,453 | 7/1995 | Higuchi | 220/3.8 |

Primary Examiner—Stephen J. Castellano
Attorney, Agent, or Firm—Mark C. Jacobs

[57] ABSTRACT

A watertight enclosure for the retention of air-cooled electrical and electronic components, which enclosure includes a labyrinth diverter system of baffles and barriers to divert any water or other liquid, that may enter the enclosure away from the components therein.

20 Claims, 4 Drawing Sheets

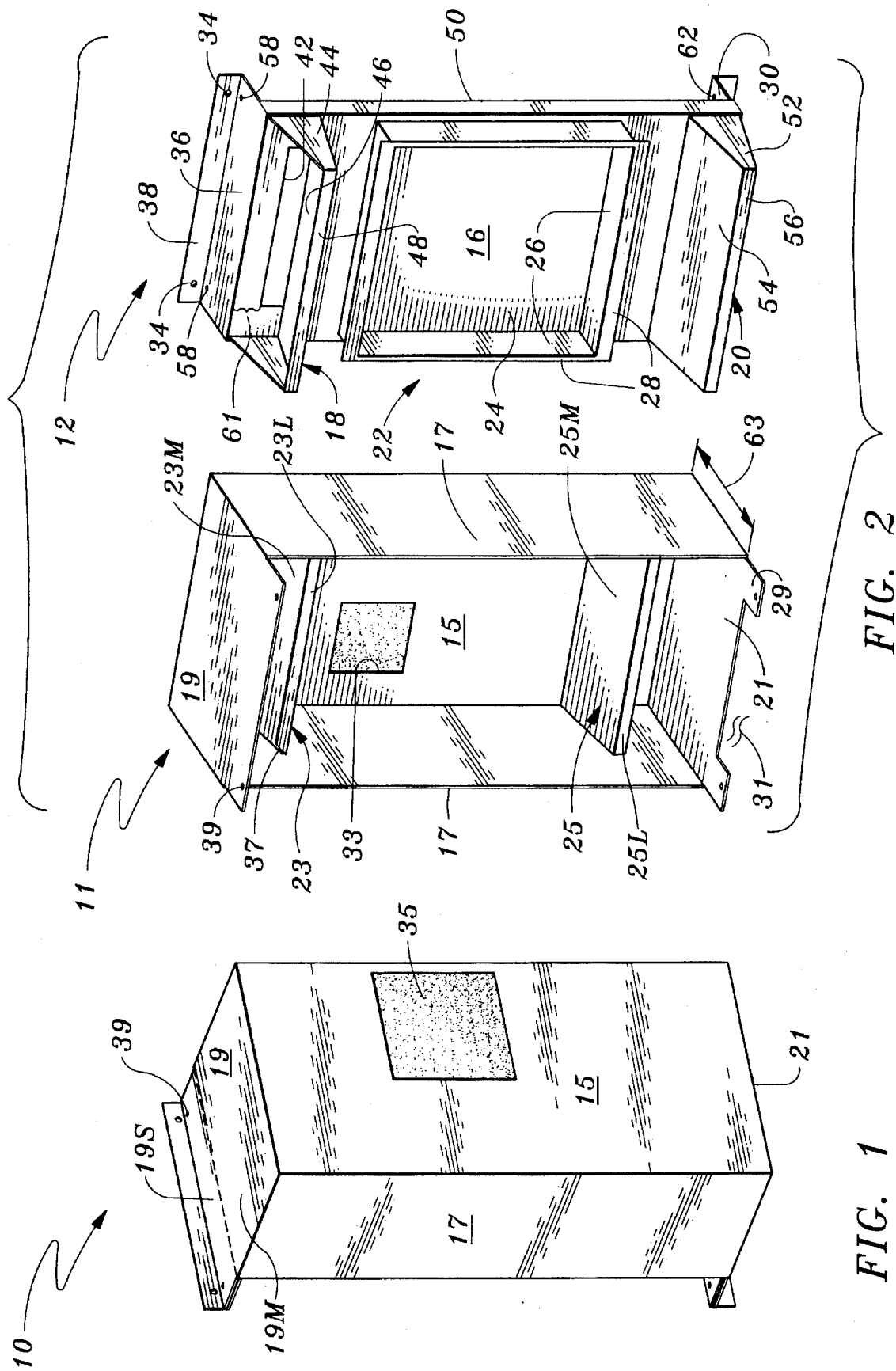

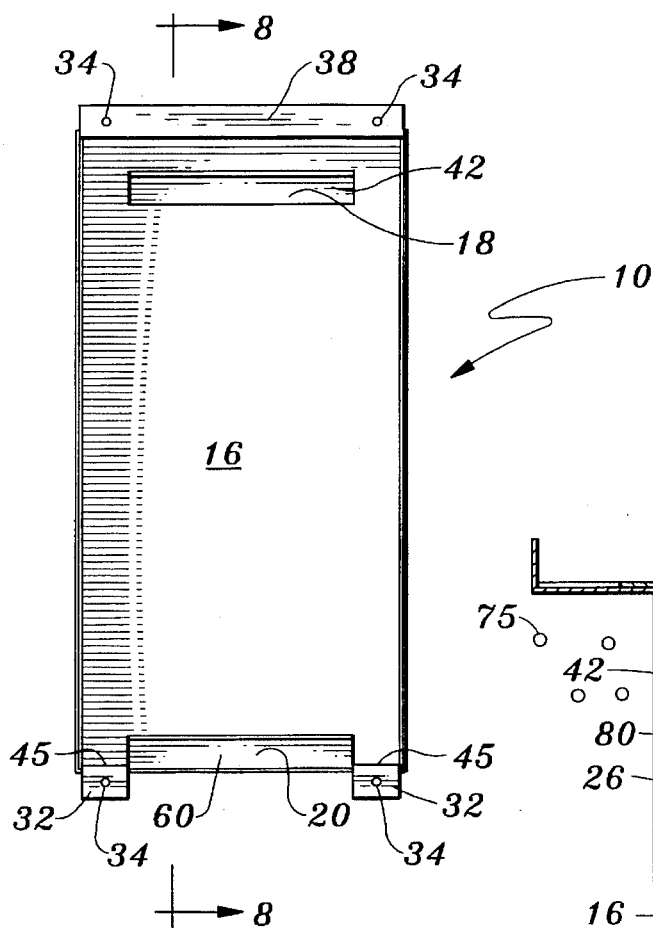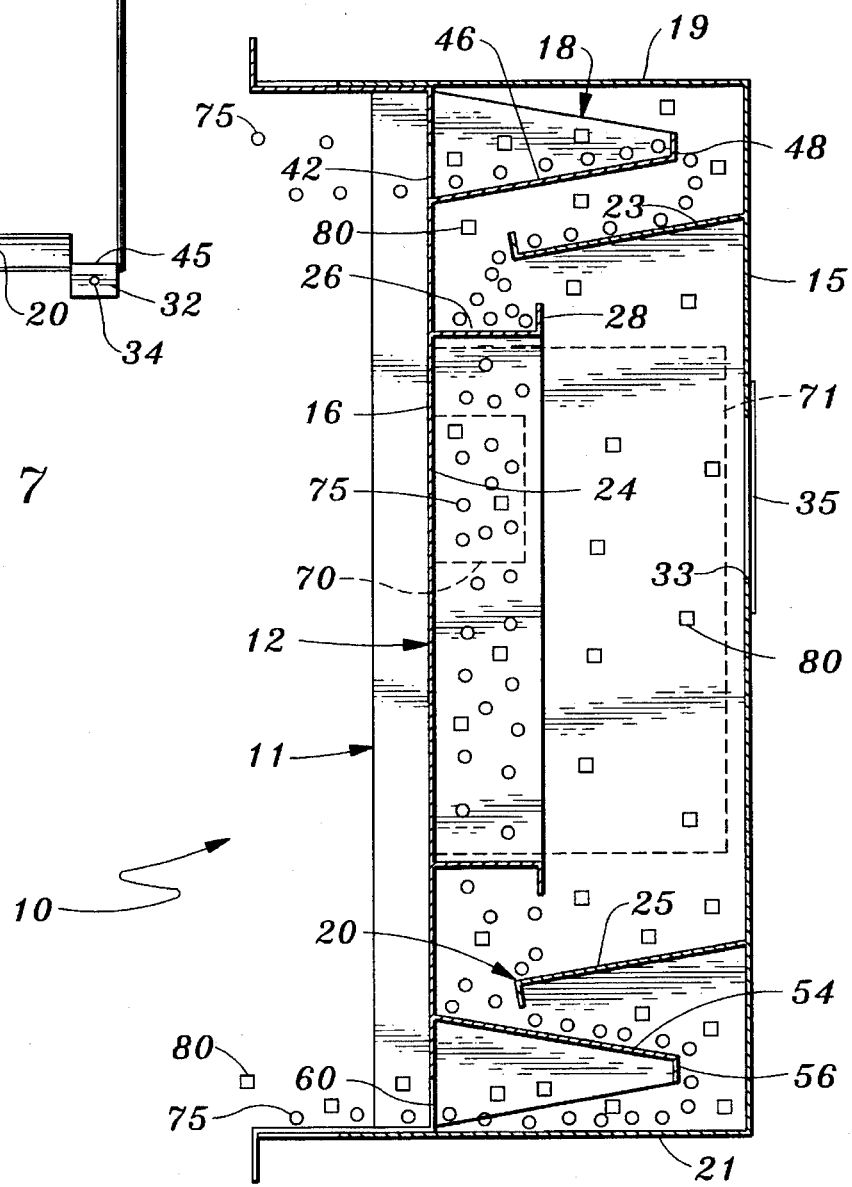
Fig. 7
Fig. 8

5,499,734

1

LABYRINTH BARRIER VENTILATED WATERPROFF ENCLOSURE

FIELD OF THE INVENTION

BACKGROUND OF THE INVENTION

One of the problems associated with heavy industry power equipment is the removal of heat. This problem has been attacked by adding heat sync and cooling fins to various apparatuses. Variable frequency drive power supplies also have the need to dissipate heat. Thus they need ventilation to move the heat out of the enclosure. Other high-tech equipment such as variable frequency drives, soft start power supplies and microprocessor controls also required heat dissipation capability and ventilated enclosures.

Such hardware can be in a ventilated enclosure with or without fans to boost air flow and cooling. Many food processing plants wash down their walls and floors frequently with high pressure hoses for cleanliness and health reasons. Therefore to avoid contact with water for these electrical components, they must be place in watertight enclosures. Such watertight enclosures, if large enough to hold a small air conditioner, occupied too much wall space in the food processing plant and are too expensive. If the equipment were to be placed in a watertight enclosure either on the floor or on the wall, the heat could not be dissipated because the watertight enclosure was also airtight, i.e., no air flow to dissipate heat.

Thus there has developed a tremendous need for a watertight enclosure that will permit airflow to pass through and around the electronic components within the housing or enclosure to cool the components therein.

It is therefore one object of this invention to provide a watertight enclosure for electrical components that permits air to flow therethrough.

A second object is to provide a wall mountable watertight enclosure that permits airflow cooling of electrical components therein.

Yet another object is to provide a NEMA 4X enclosure for electronic power supplies and the like.

Still another object is to provide an enclosure for electrical and electronic components that permits airflow from beneath to enter and cool components, yet water that may enter from the top as a result of a hosing or other washing of the wall or ceiling will be diverted away from the components.

A yet further object is provide a NEMA 4X enclosure that diverts water that may enter from the top or bottom of a wall mounted unit and then diverts the water away from electrical components mounted with the enclosure.

One additional object is to provide a multimode system for diverting water away from electrical components in an airflow permitting watertight enclosure.

And lastly, but not least, it is an object of this invention to provide an enclosure that uses a labyrinth system to divert water entering the enclosure from hitting the electrical components within the enclosures.

Other objects of the invention will in part be obvious and will in part appear hereinafter.

The invention accordingly comprises the product possessing the features properties and the relation of components which are exemplified in the following detailed disclosure and the scope of the application of which will be indicated in the appended claims.

For a fuller understanding of the nature and objects of the invention reference should be made to the following detailed description, taken in conjunction with the accompanying drawings.

BRIEF DESCRIPTION OF THE FIGURES

FIG. 1 is a front perspective view of the apparatus of this invention.

FIG. 2 is a top perspective of the interiors of the front and rear portions of this invention.

FIG. 7 is a rear elevational view of this invention.

FIG. 8 a cutaway view showing the flow of any undesired fluid that may enter the apparatus, flow through the apparatus and out the bottom thereof.

SUMMARY OF THE INVENTION

An optionally wall mountable, two portion enclosure for the receipt of electrical and electronic components that is watertight yet permits airflow for the cooling of said components is provided. The unit is vented to permit airflow, to enter one end and exit the other end. A series of baffles and barriers configured as a labyrinth diverts any water that may enter through the cooling vents away from the electrical/ electronic components housed in the enclosure. Depending on size and application the labyrinth may consist of from one to thirty baffles and barriers or more.

DESCRIPTION OF THE PREFERRED EMBODIMENT

In FIG. 1 there is shown the apparatus 10, of this invention assembled for use. The inventive apparatus comprises two portions, per FIG. 2, a front or top portion 11, and a base or rear portion 12. Dual names are given to each portion, because the applicable name will be dependent upon whether the invention is wall mounted or backboard mounted and permitted to rest on the floor with a back panel. The preferred form of use, however, is as a wall-mounted enclosure.

Figure 3:
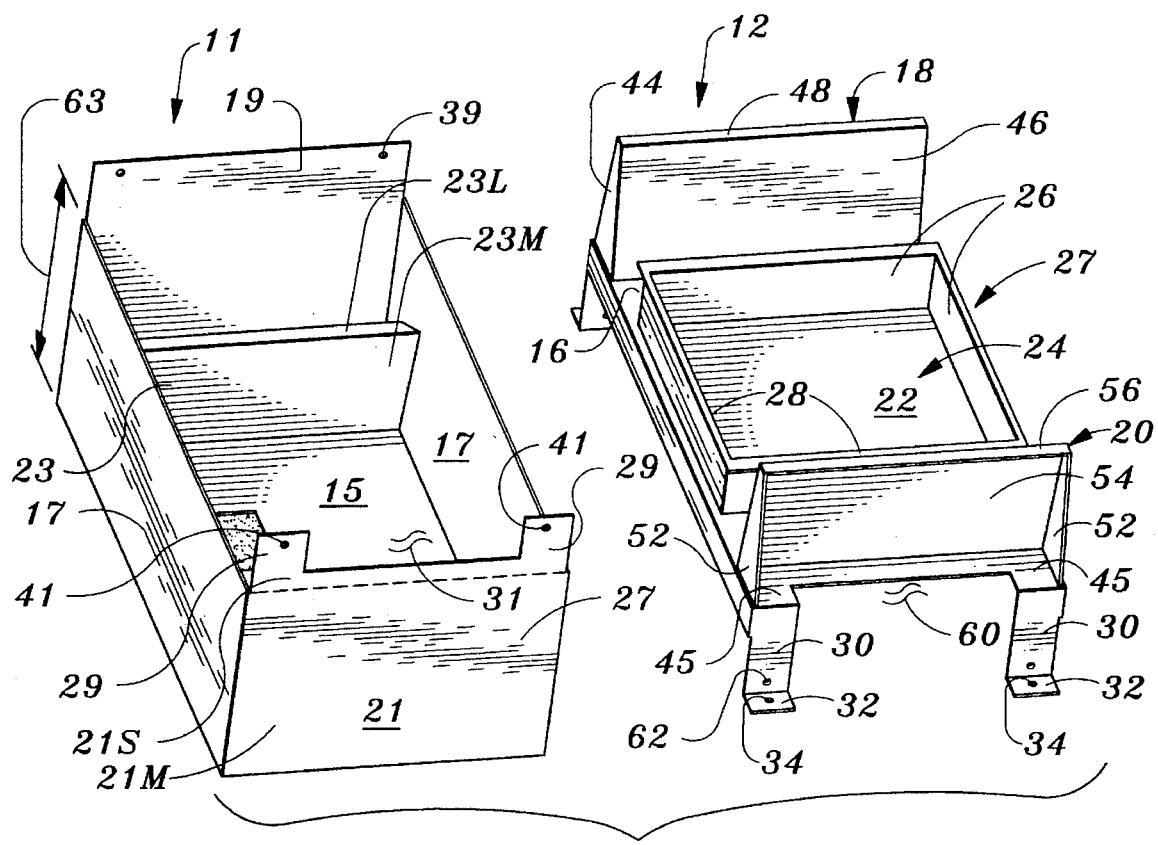
FIG. 3 is a bottom perspective view of the interiors of the front and rear portions of this invention.

Front portion 11 is configured as a box having a front wall 15, spaced sidewalls 17 normal thereto, and a spaced top wall 19 and a bottom wall 21, normal to said sidewalls and normal to said front wall, seen in FIG. 3. The rear side of the front portion is open as is seen in FIG. 2.

Figure 6:
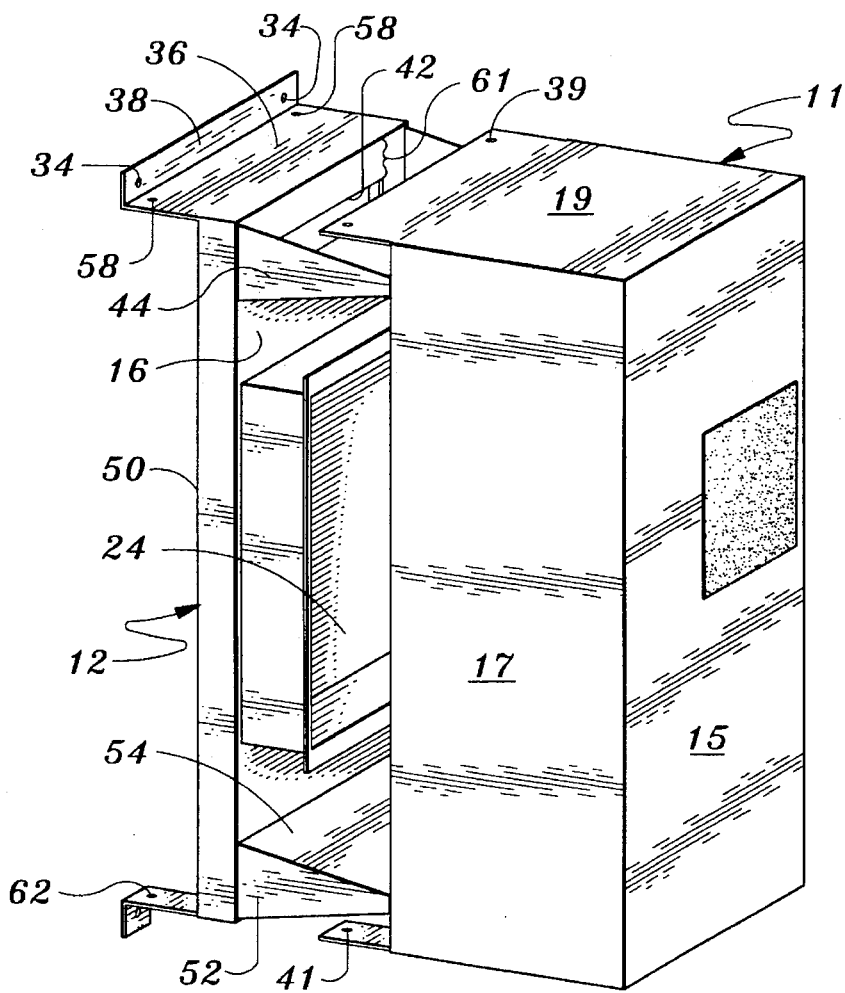
FIG. 6 is a left perspective illustrating the engagement of the front portion with the rear portion of this invention.

Top wall 19 has a pair of spaced bores 39, see also FIG. 6, for alignment with bores 58 of the rear portion 12, for the receipt of assembly sheet metal screws not shown.

Figure 4:
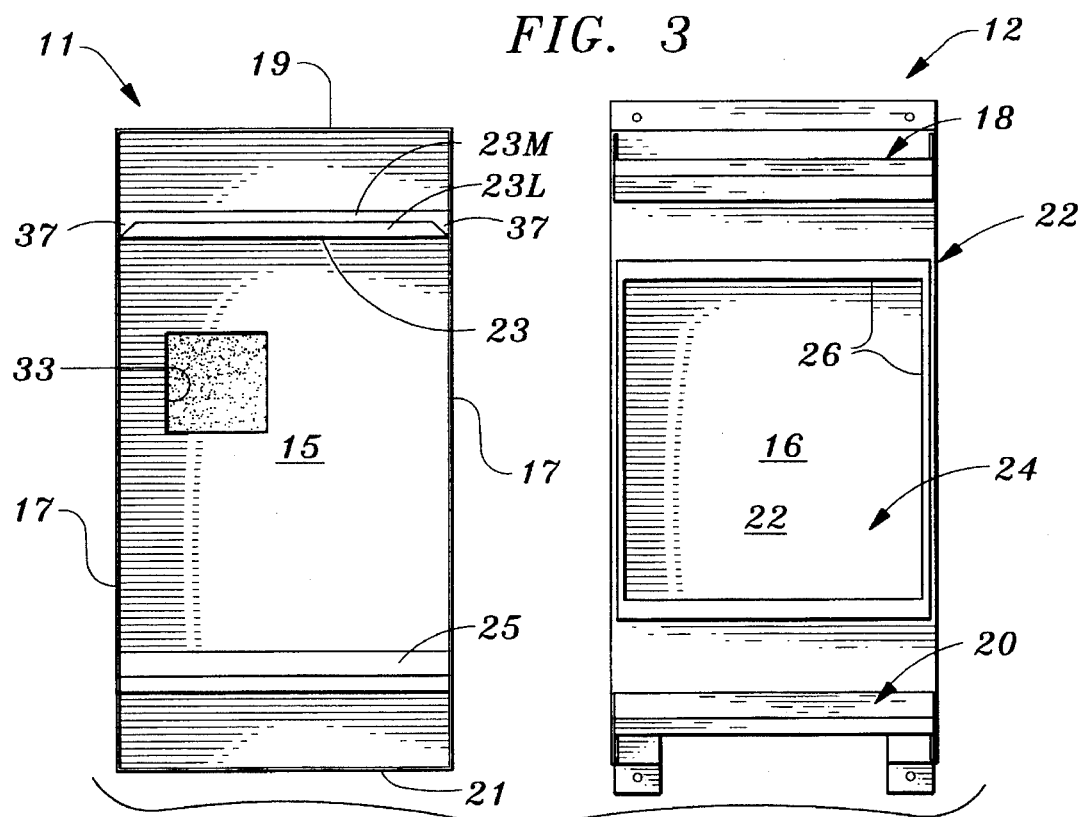
FIG. 4 is an elevational view of the interiors of the front and rear portions of the enclosure of this invention.

The bottom wall 21 per FIG. 3, is seen in FIG. 4 to have a main section 27 and a pair of spaced corner tabs 29 extending rearwardly therefrom. An elongated cutout for reasons to be recited later exists between the two corner tabs 29. Each tab 29 includes a central screw hole 41 for alignment with screw holes 62 as seen in FIGS. 2 and 6 for assembly of one portion of the invention to the other.

Figure 5:
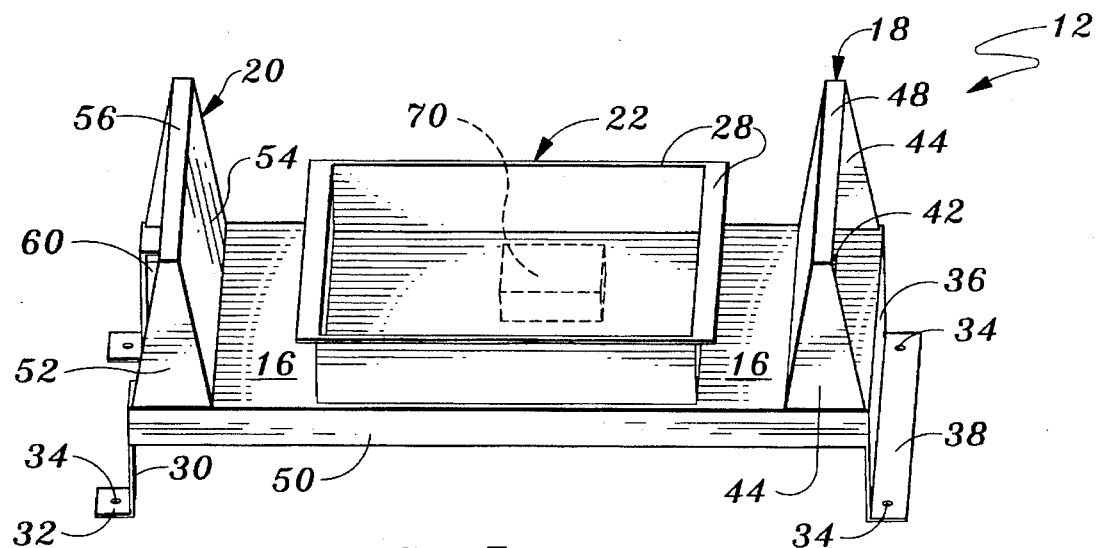
FIG. 5 is a right perspective view of the interior of the rear portion of this invention.

Whereas the two sidewalls 17 are of equal dimension and of a rectangular configuration, the top and bottom walls are deeper than the two sidewalls. Thus from FIG. 1 it is seen that top wall 19 includes a main section 19M whose depth is equal to the depth of the sidewall 17, and a standoff section 19S disposed directly to the rear of main section 19M as is seen in FIG. 5 or FIG. 6. The dashed line shown separating section 19M from 19S is an imaginary line and is therefore unnumbered.

In FIG. 3, the greater dept of the bottom wall 21 is seen. Here main section 21M is equal in depth to the depth of the two sidewalls, but the abutted standoff section 21S extends further rearwardly from the imaginary line separating the two, which again is unnumbered. Corner tabs 29 and the cutout 31 therebetween are seen to extend rearwardly in the same plane as a component of standoff section 21S.

A decal or a plastic cover plate, transparent or one containing nomenclature may be located as element 35. It is also seen that switches or other hardware could replace such a cover element as may be desired. Whatever the nature of the element 35, it is conventionally mounted as by stainless steel screws or suitable bolts and nuts, or adhesive backed overlay of Mylar™ or other suitable covering with appropriate nomenclature, depending upon the nature of the element employed.

The reader is now referred to FIGS. 2, 3, and 4 for a discussion of the interior of the front portion. It is seen that the interior of the front portion 11 includes a pair of spaced baffles 23, 25, designated the upper and lower baffles respectively. Each of these baffles is spaced from the other and equally spaced from its respective closest wall, i.e., the top wall 19 and the bottom wall 21. Each of these baffles includes a main section 23M and 25M respectively, which main sections are angled downwardly within the range of 10 to about 25 degrees from the horizontal (when the invention is in a standing orientation as shown in FIG. 3). Ten degrees the preferred inclination. Each baffle extends outward from the rear surface of the front wall 11 about ⅔rds of the depth of each of the sidewalls.

The upper baffle includes a generally vertical lip, 23L, while the lower baffle includes a downwardly extending lip 25L. Lower lip 25L extends full width across the baffle between the two sidewalls of the front portion 11. The upper lip 23L, however, includes a pair of notches, 37, each of which extends inwardly from one end of the extremity of the lip. These notches may be vertical or inclined inwardly as shown in FIG. 3. The purposes of these notches is to permit any water that may have been collected on the baffle to exit therefrom in a directed manner at each of the outer ends of the lip such as to be able to run down the inside surface of the two sidewalls 17.

A view cutout 33 is seen to be strategically located in the front wall 15. As noted above element 35 overlays this cutout 33.

It is also seen from these three figures that the depth 63 of each of the sidewalls 17 is less than the depth of each of the top and bottom walls 19 and 21. Depth 63 corresponds to the depth of the main segments of each of the top and bottom wall's main sections 19M and 21M respectively. See FIGS. 1 and 3.

The discussion now moves to back or rear portion 12. Therefore reference should be made to all of FIGS. 2, 3, 4, 5, and 6. The back or rear portion of this apparatus 10 in its anticipated vertical in-use orientation in FIGS. 2 and 4 and is best seen in perspective in FIG. 5.

Base or rear portion 12 includes a base panel 16 of a generally rectangular configuration, which panel has a transverse slot 42 therein spaced inwardly a finite distance 61, from the upper end of said base portion, (see FIGS. 2 & 7). A cutout 60, spaced equidistant from each side of the panel 16 and sized substantially the same as slot 42 is found at the lower edge of the panel 16. Again see FIG. 7. A connector section 45 of panel 16 is positioned external to both sides of cutout 60. The two connector sections 45, are each of the finite width 61. Disposed normal to each of these connector sections 45, is the upper end of a tab 30, having a central screw bore 62 therein per FIG. 6. Each tab 30 is seen to be directed rearwardly as per FIG. 2. Disposed at the lower end of each tab 30 is an outwardly projecting tab 32, each of which also has a central bore designated 34 therein.

Extending downwardly from panel 16 is a full length lip 50 which also serves as a connector panel between the tab 30 discussed above which is disposed normal to said panel 50, and normal to an offset plate 36 which is disposed at the top of the apparatus, normally and rearwardly of the upper edge of the base panel 16, (see FIG. 2). Preferably the connector section 50 is welded or otherwise secured along its depth to each of the offset plate 36 and each rearwardly disposed tab 32.

The offset plate 36 includes a pair of horizontally spaced apertures 58 near the distal end thereof. See FIG. 6. Disposed normal to and upwardly from the offset plate 36 is a mount plate 38 that extends the full width of the base panel 16. The mount plate also has a pair of horizontally spaced and correspondingly spaced apertures 34 therein. Mount plate 38 is seen to be oppositely directed from the two tabs 32.

Centrally disposed and projecting forwardly from said panel 16 is a box barrier 22 (FIG. 5) within the confines of which is an equipment mounting area 24 which is indeed a section of base panel 16 surrounded by two pairs of spaced box walls, each box wall designated 26, and disposed normal to the next adjacent box wall and normal to the base panel 16 and welded or otherwise attached to the base panel and each other. As seen in FIG. 5 the box walls are upstanding, but in reality per their normal disposition they are forwardly projecting. Each upstanding box wall includes an outwardly extending lip 28 per FIGS. 4 and 7.

Spaced equally in opposite directions from the box barrier 22 and also mounted to base panel 16 are a pair of mirror image labyrinth barriers, 18 and 20. These are best seen in FIGS. 4, 5, and 7. Labyrinth barrier 18, designated the upper barrier includes a main plate 46 that is disposed slightly upwardly from the horizontal and which extends the full width of the base panel 16 outwardly from said base panel 16. Main plate 46 has an upwardly extending lip 48 disposed between two spaced reinforcing gussets 44 which are vertically disposed and which also extend outwardly from said base panel 16 to said lip. The entire labyrinth barrier both 18 and 20 may be formed from one piece of sheet metal appropriately bent and preferably welded, or sealed along all adjoining edges.

The lower labyrinth barrier 20 is of similar construction and may be formed in the same manner. Its main plate is designated 54, and is downwardly depending unlike its upper namesake. The lower labyrinth's full width lip 56, is downwardly directed not upwardly, and the two spaced lower gussets are designated 52 in the same figures previously referenced. From a front elevation each of the upper and lower barrier's is of a generally U-shape configuration.

The angle of inclination of each of the labyrinth baffles is usually set the same, but need not be. This angle can vary for the upper labyrinth from about 60° to about 100° upwardly from the vertical, and downwardly for the lower barrier within the same range. The preferred angle of disposition for the upper labyrinth barrier is 80° up from the vertical and for the lower labyrinth barrier, 100° down from the vertical.

The spaced slot previously described is preferably located above the upper barrier, and the cutout is disposed preferably below the lower barrier.

Having described the two portions separately, the discussion now turns to the meshing of the two halves as seen to be in progress in FIG. 6 and as seen as accomplished in FIGS. 1 & 7, and the utilization of the apparatus. Subsequent thereto the discussion will refer to FIG. 8 concerning fluid flow.

Prior to engaging the two portions of the apparatus; namely, the front portion and the rear portion, any electronic equipment such as element 70, which may be any of, but not necessarily limited to a variable frequency drive, a soft start power supply, a microprocessor controlled device, et cetera all typified by designator 70 as seen in FIG. 5 should be conventionally mounted in the mounting area 24 of box barrier 22. The width and elevation of the rear portion are slightly smaller than the width and elevation of the front portion to permit the rear portion to telescope into the front portion both a friction fit. The mount plate 38 serves as a lower stop to prevent further insertion and the tabs of the front portion prevent further insertion at the top as the tab from the rear portion impact them upon full insertion. Rear portion 12 is inserted into front portion 11 such that offset plate 36 is disposed beneath the top wall 19 of the front portion. Insertion can proceed until the edge of top wall 19 impacts against mount plate 38 which acts as a stop.

At the lower end of the apparatus, the corner tabs 29 of the front portion are seen to extend rearwardly and serve as a stop for tabs 32 of the rear portion, which tabs 32 descend downwardly. When both portions are fully engaged, four sets of two aligned bores will be seen. At the top, bores 39 should align with bores 58. At the bottom bores 62 and 39 should align. When these four sets of two bores are in alignment, conventional fastening bolts and nuts not shown may be utilized to attach one portion to the other. The apparatus 10 is now ready for mounting, preferably to a substrate such as a wall or a floor.

FLUID FLOW THROUGH THE APPARATUS

Reference is now made to FIG. 8 which shows the fluid flow when liquid inadvertently enters the apparatus, as well as showing the fluid flow for air used to cool the electrical component 70. This figure, which basically represents a side cutaway view of the apparatus with the two portions engaged, depicts the downwardly flow of water designated by the circles 75, and the upwardly movement of air designated by the squares 80 through the apparatus. The air is needed to cool the electrical components 70 that are mounted within the box barrier 22 in order to ensure safe and proper functionality. Since warm air rises, the ambient temperature air is drawn in through the lower slot, i.e., cutout 60 and exits out the slot 42. Such air movement can transpire since apparatus 10 is mounted spaced from the wall via mount plate 38 and tabs 29.

Since the apparatus is intended for use in food plants where by law it is necessary to wash down the walls the possibility of unwanted water entering an air cooled electrical components box is readily seen, especially when the box is mounted in a standoff position relative to its mounting surface. Thus water, solvent or other cleansing agent, (water) could ricochet off the mounting wall and enter the apparatus through slot 42 as is shown in FIG. 8. Such water would enter slot 42 and accumulate on labyrinth barrier 18, then as shown flow onto upper baffle 23, which has the notched corners 37 in the lip 23L such that water is diverted from baffle 23 down and around both sides of the box barrier 22, and perhaps—depending on the quantity of fluid, over the front of the box barrier's lip 28. See FIG. 8. Water will then travel either directly onto lower barrier 20 or indirectly thereto after first impacting the lower baffle 25 which has no notches in its downturned lip. Fluid will then exit out of cutout 60 beneath the lower labyrinth baffle rearwardly and down the wall, not shown.

It was indicated that the view cutout 33 was strategically located. This location corresponds with the interior of the box barrier such that the electrical components 70 can be seen, or if required nay manually operated switches that need to extend outside of the apparatus can be mounted at this location using conventional watertight sealing means.

The apparatus of this invention is designated as a NEMA 4X box, i.e., a watertight enclosure.

In tests on various samples of the apparatus it has been found that when hose pressures as high as 80 PSI from hoses used to clean the walls of a major soup manufacturer located in Sacramento Calif., that water that may have either ricocheted off the wall or been sprayed directly into the rear of the apparatus and entered either the slot 42 or cutout 60 did not reach the electronics 70 mounted within the confines of the box barrier.

In the manufacture of this apparatus conventional materials can be used, such as epoxy coated steel, or aluminum alloy. The apparatus can be sized from about 12"×12"×18" inches up to 48"×48"×90" and even larger as may be required.

As noted earlier the front panel may include either a viewing window, such as made of polycarbonate, and sealed into place in conventional fashion from inside the first portion or that location can be made without a cutout and merely covered with a decal or other identifying indicia.

While the apparatus as seen in FIG. 8 includes a pair of baffles and a pair of barriers it is to be seen that even pairs of baffles and barriers are not required. The minimum requirement is for one upper barrier and one upper baffle, and there is no minimum requirement on lower baffles and/or barriers. Of course, more barriers and baffles can be used than two pair. Thus there could be two spaced upper barriers and upper baffles but only one lower of each, ad infinitum.

In FIG. 4, a small electronic element such as a variable frequency drive designated 70 is shown disposed within the confines of the box barrier 22. It should be understood, however, that the total mass that can be occupied by such one or more electronic/electrical components is much larger. Thus designator 71 as seen in FIG. 8 typifies the maximum size of such an alternate electronic/electrical component(s) to the VFD 70 that may be disposed within the confines of the box barrier 22. Obviously the mode of securing such components as 70 or 71 in place is within the skill of the art.

Since certain changes may be made in the above apparatus without departing from the scope of the invention herein involved, it is intended that all matter contained in the above description and shown in the accompanying drawings shall be interpreted as illustrative and not in a limiting sense.

I claim:

1. An air-cooled watertight apparatus for the retention of electrical components in an environment where liquid may be present and which liquid would enter the apparatus, which apparatus comprises:

(1) a front portion and rear portion, the front portion of which is configured as a box having a front wall, spaced sidewalls normal thereto, and spaced top and bottom walls normal to said sidewalls and normal to said front wall, said front portion having in the interior thereof, a pair of spaced baffles, an upper baffle and a lower baffle, each of which baffles extends rearwardly from the front wall of said first portion;

(2) a rear portion having a base panel which panel has an upper end and a lower end, and which base panel has a transverse slot spaced down from the upper end thereof; and a box barrier having two pairs of spaced side walls each of which is normal to the next adjacent wall, and each of which projects normally from said base panel to define an open box, and a pair of spaced barriers one above and one below the box barrier, one of said barriers being an upper barrier and having a main plate disposed angularly upward from said base panel, and the other being a lower barrier and having a main plate disposed downwardly relative to said base panel, and wherein the width and elevation of the rear portion are slightly smaller for the rear portion to permit insertion of the rear portion into the front portion, and stop means to limit the insertion of the rear portion into the front portion.

2. In the apparatus of claim 1 wherein in the front portion, the top and bottom walls are deeper than the sidewalls.

3. In the apparatus of claim 2 wherein the front portion's bottom wall includes a pair of spaced rearwardly extending tabs.

4. In the apparatus of claim 1 wherein the rear portion includes an upwardly extending mount plate.

5. In the apparatus of claim 1 wherein the upper baffle of the front portion is disposed angularly downwardly and has an upstanding lip, and the lower baffle of said portion is also disposed angularly downwardly and has a downwardly extending lip.

6. In the apparatus of claim 5 wherein the upstanding lip of the upper baffle is notched at each corner.

7. In the apparatus of claim 5 wherein the two baffles are disposed downwardly at about the same angle, and extend to and between the sidewalls.

8. In the apparatus of claim 1 wherein the slot of the rear portion is disposed above the upper barrier and the cutout is disposed below the lower barrier.

9. In the apparatus of claim 1 wherein each wall of the box barrier includes an outwardly extending lip disposed generally parallel to the base panel.

10. In the apparatus of claim 1 wherein each main plate of the upper and lower barriers have gussets at each end thereof disposed normal to the main plate.

11. In the apparatus of claim 10 wherein the gussets of the upper barrier are disposed upwardly at each end of the main plate, and the gussets of the lower barrier are disposed downwardly at each end of the main plate.

12. In the apparatus of claim 11 wherein each barrier includes a front lip extending in the same direction as the gussets.

13. In the apparatus of claim 1 wherein the stop means comprises the combination of a mount plate and a pair of tabs directed oppositely from said mount plate.

14. In the apparatus of claim 1 wherein the base panel of the rear portion has a normally directed connector panel along the length of each side of said base panel.

15. In the apparatus of claim 14 wherein the base panel further includes an offset plate normal to and along the upper edge of said base panel.

16. In the apparatus of claim 15 wherein the offset panel and the mount plate each include a pair of horizontally spaced apertures therein for use in mounting the apparatus to a substrate.

17. An air-cooled watertight apparatus for the retention of electrical components in an environment where liquid may be present and which liquid would enter the apparatus, which apparatus comprises:

(1) a front portion and rear portion, the front portion of which is configured as a box having a front wall, spaced sidewalls normal thereto, and spaced top and bottom walls normal to said sidewalls and normal to said front wall, said front portion having in the interior thereof, a pair of spaced baffles, an upper baffle and a lower baffle, each of which baffles extends rearwardly from the front wall of said first portion, the said upper baffle having an upstanding lip, which upstanding lip is notched at each corner;

(2) a rear portion having a base panel which panel has an upper end and a lower end, and which base panel has a transverse slot spaced down from the upper end thereof; and a box barrier having two pairs of spaced side walls each of which is normal to the next adjacent wall, and each of which projects normally from said base panel to define an open box, and a pair of spaced barriers one above and one below the box barrier, one of said barriers being an upper barrier and having a main plate disposed angularly upward from said base panel, and the other being a lower barrier and having a main plate disposed downwardly relative to said base panel, and wherein the width and elevation of the rear portion are slightly smaller for the rear portion to permit insertion of the rear portion into the front portion, and stop means to limit the insertion of the rear portion into the front portion and further wherein the front portion's bottom wall includes a pair of spaced rearwardly extending tabs, and the rear portion includes an upwardly extending mount plate.

18. An air-cooled watertight apparatus for the retention of electrical components in an environment where liquid may be present and which liquid would enter the apparatus, which apparatus comprises:

(1) a front portion and rear portion, the front portion of which is configured as a box having a front wall, spaced sidewalls normal thereto, and spaced top and bottom walls normal to said sidewalls and normal to said front wall, said front portion having in the interior thereof, a pair of spaced baffles, an upper baffle and a lower baffle, each of which baffles extends rearwardly from the front wall of said first portion, and wherein the upper baffle of the front portion is disposed angularly downwardly and has an upstanding lip, and the lower baffle of said portion is also disposed angularly downwardly and has a downwardly extending lip;

(2) a rear portion having a base panel which panel has an upper end and a lower end, and which base panel has a transverse slot spaced down from the upper end thereof; and a box barrier having two pairs of spaced side walls each of which is normal to the next adjacent wall, and each of which projects normally from said base panel to define an open box, and wherein each wall of the box barrier includes an outwardly extending lip disposed generally parallel to the base panel;

a pair of spaced barriers one above and one below the box barrier, one of said barriers being an upper barrier and having a main plate disposed angularly upward from said base panel, and the other being a lower barrier and having a main plate disposed downwardly relative to said base panel, and wherein the width and elevation of the rear portion are slightly smaller for the rear portion to permit insertion of the rear portion into the front portion, and stop means to limit the insertion of the rear portion into the front portion.

19. In the apparatus of claim 18 wherein the stop means comprises the combination of a mount plate and a pair of tabs directed oppositely from said mount plate.

20. In the apparatus of claim 18 wherein the base panel of the rear portion has a normally directed connector panel along the length of each side of said base panel, and the base panel further includes an offset plate normal to and along the upper edge of said base panel.

* * * * *